(12) United States Patent
Chen et al.

(10) Patent No.: US 6,882,188 B1
(45) Date of Patent: Apr. 19, 2005

(54) INPUT/OUTPUT BUFFER

(75) Inventors: Sheng-Hua Chen, Kaohsiung (TW); Hung-Yi Chang, Hsinchu (TW); Jeng-Huang Wu, Taipei (TW)

(73) Assignee: Faraday Technology Corp., Hsinchu (TW)

( * ) Notice: Subject to any disclaimer, the term of this patent is extended or adjusted under 35 U.S.C. 154(b) by 0 days.

(21) Appl. No.: 10/673,391

(22) Filed: Sep. 30, 2003

(51) Int. Cl.$^7$ ................................. H03B 1/00
(52) U.S. Cl. ................... 327/112; 327/108; 327/170; 326/83
(58) Field of Search ............... 327/108–112, 170, 327/534, 537, 389, 391, 333; 326/26, 27, 81, 83

(56) References Cited

U.S. PATENT DOCUMENTS 5,160,855 A * 11/1992 Dobberpuhl ............... 327/108
5,966,026 A * 10/1999 Partovi et al. ............... 326/27
6,084,431 A * 7/2000 Shigehara et al. ........... 326/81
6,320,415 B1 * 11/2001 Lee ............................. 326/81

* cited by examiner

Primary Examiner—Long Nguyen
(74) Attorney, Agent, or Firm—Rabin & Berdo, P.C.

(57) ABSTRACT

An input/output buffer. An input/output circuit has a transmission terminal coupled to an I/O pad, and a floating N-well region. A P-gate control circuit conveys the second gate control signal to the gate of the first PMOS transistor. A feedback detection device is coupled between the transmission terminal and an N-well control circuit to output a feedback signal according to an input voltage at the I/O pad. The N-well control circuit adjusts the voltage level at the N-well region of the first PMOS transistor according to the feedback signal output from the feedback detection device.

9 Claims, 6 Drawing Sheets

INPUT/OUTPUT BUFFER

BACKGROUND OF THE INVENTION

1. Field of the Invention

The present invention relates to an input/output buffer, and more particularly, to an input/output buffer capable of accepting an input logic signal voltage higher than the system voltage.

2. Description of the Related Art

Conventionally, most IC devices are driven by a system voltage in the range of 0–5V. In these IC devices, high-voltage logic signals are set at the system voltage and low-voltage logic signals at the ground voltage. With advances in semiconductor technology, however, the system voltage can be reduced to 3.3V because the gate oxide layers in the IC device are thinner. Still lower system voltage may be possible in the future. In practice, however, an New 3.3V IC device is usually used in conjunction with older 5V peripheral devices. For instance, an New 3.3V VGA (video graphic adapter) may be used in conjunction with other older 5V peripheral devices in a personal computer. Compatibility between the new 3.3V devices and the older 5V devices can thus be a problem.

Figure 1:
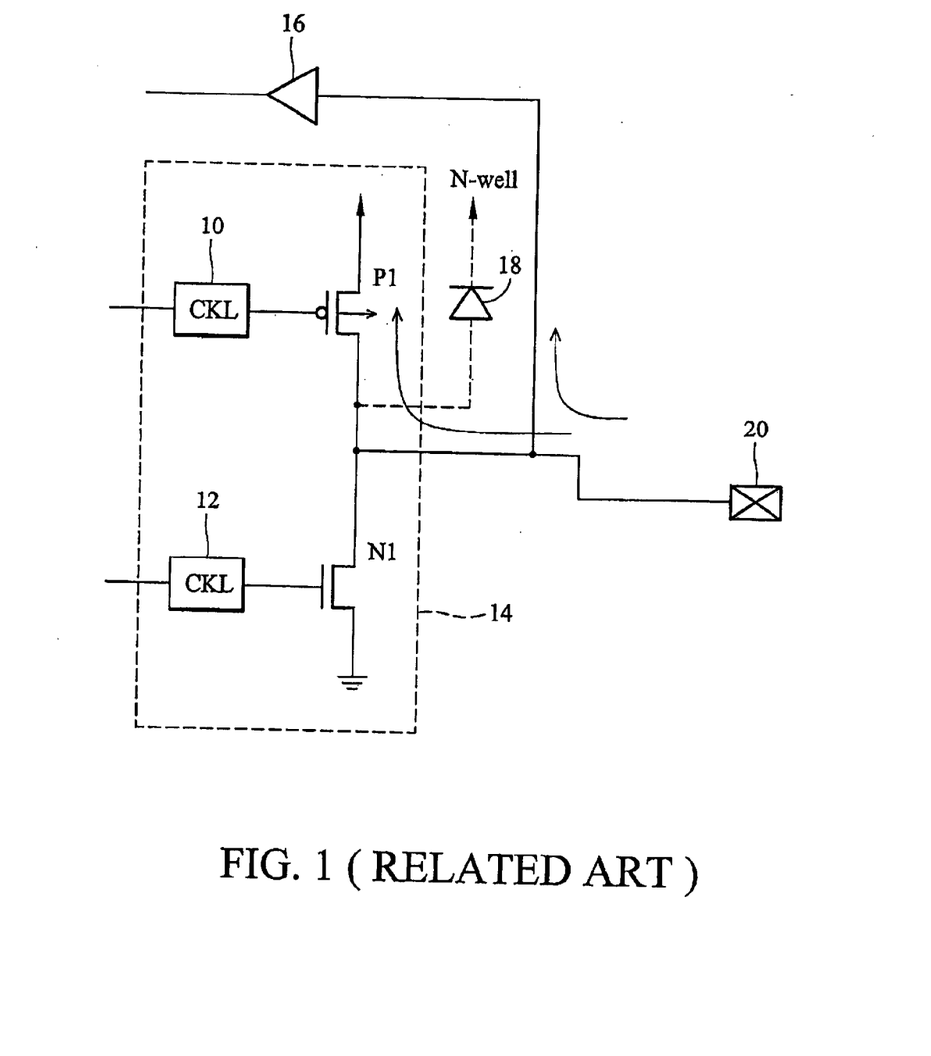
FIG. 1 is a diagram of a conventional input/output buffer.

FIG. 1 is a schematic circuit diagram showing the circuit structure of a conventional I/O buffer 14 used in a 3.3V IC device. As shown, the I/O buffer 14 is coupled to an input buffer 16 and an I/O pad 20 of an IC device. The I/O buffer 14 is composed of a first circuit 10, a second circuit 12, a PMOS transistor P1, and an NMOS transistor N1. When the I/O buffer operates in input mode, both the PMOS transistor P1 and the NMOS transistor N1 must be switched to an Non-conducting state. To do this, the first circuit 10 outputs a high-voltage signal, for example 3.3V, to the gate of the PMOS transistor P1, thereby switching the PMOS transistor P1 to an Non-conducting state. Meanwhile, the second circuit 12 outputs a low-voltage signal, for example 0V, to the gate of the NMOS transistor N1, thereby switching the NMOS transistor N1 to an Non-conducting state.

However, if the I/O pad 20 receives a 5V input logic signal, it subjects the PMOS transistor P1 to a gate voltage of 3.3V, a drain voltage of 5V, and a source voltage of 3.3V. Since the gate voltage (3.3 V) is lower than the drain voltage (5 V) at the PMOS transistor P1, the gate voltage switches the PMOS transistor P1 to a reverse conducting state. Moreover, since the PMOS transistor P1 is formed on N-type substrate and its source and drain are both P-type, a PN junction diode is formed between its drain and the N-well region. Furthermore, since the drain of the PMOS transistor P1 is connected to the I/O pad 20, now receiving the 5V input logic signal, higher than the 3.3V system voltage, and the substrate thereof is connected to the 3.3V system voltage, the PN junction diode is subjected to a forward bias, causing an undesired large current between the external 5V source and the internal 3.3V source.

Figure 2:
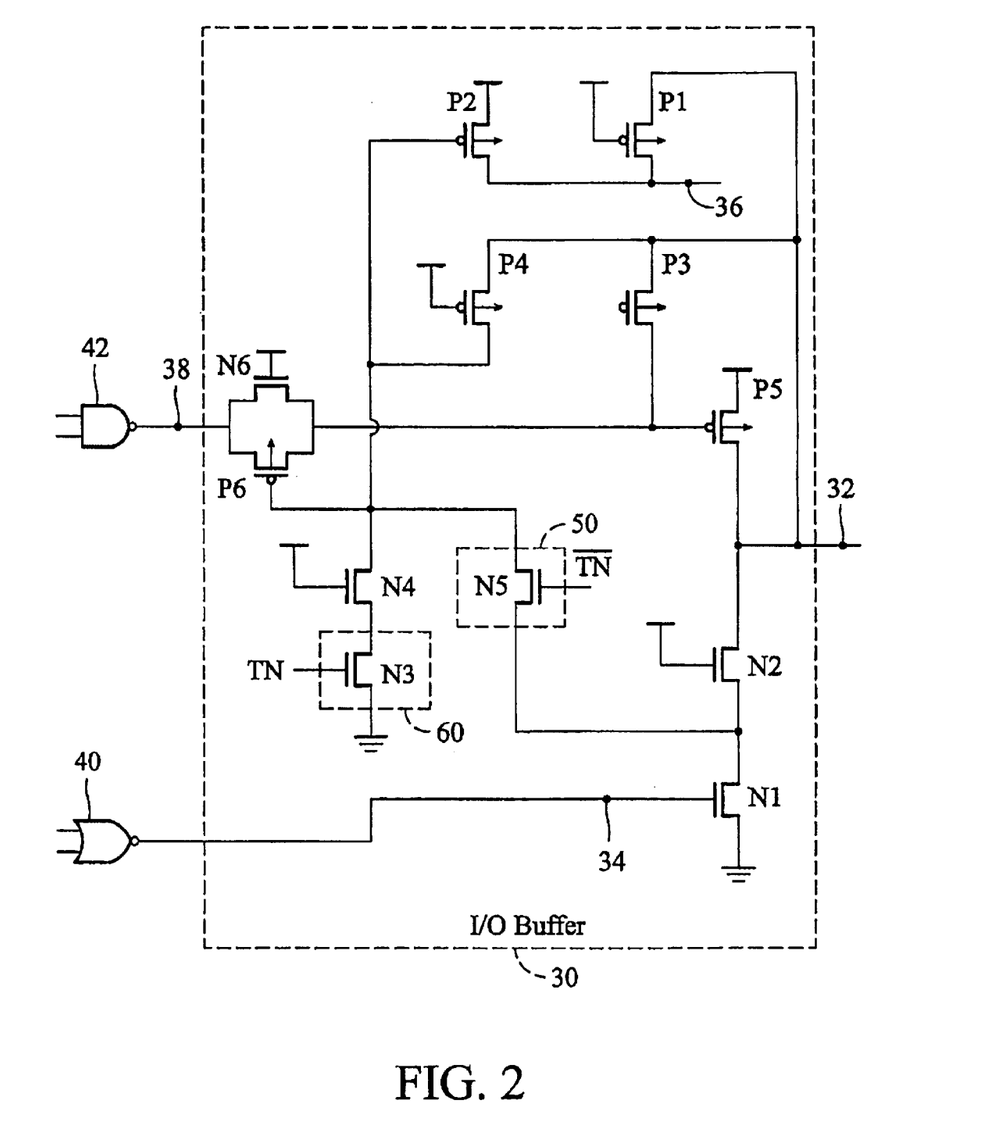
FIG. 2 is a schematic diagram showing an I/O buffer capable of accepting an input logic signal voltage higher than the system voltage.

As a solution, an improved I/O buffer for the 3.3V IC is disclosed in U.S. Pat. No. 6,011,409. FIG. 2 is a schematic diagram showing an I/O buffer capable of accepting an input logic signal voltage higher than the system voltage. When the I/O buffer 30 operates in input mode, both the PMOS transistor P5 and the NMOS transistor N1 are switched to an Non-conducting state. Moreover, the I/O control signals TN=0(0V) and /TN=1(3.3V) are issued to the I/O buffer, respectively switching the NMOS transistor N3 to an Non-conducting state and the NMOS transistor N5 to a conducting state. In this condition, if the input signal to the I/O port 32 is 5V, it can be transferred via the PMOS transistor P1 to the floating N-well region, thus setting N-well region 36 at 5V. When the voltage state at the I/O port 32 is switched from 5V to 0V, it switches the PMOS transistor to an Non-conducting state. At this time, since the NMOS transistors N2 and N5 are in a conducting state, the 0V signal can be transferred to PMOS transistor P2, thereby causing the PMOS transistor P2 to be switched to a conducting state. As a result, the system voltage of 3.3V is transferred via the PMOS transistor P2 to the floating N-well region 36, thereby setting the floating N-well region at 3.3V. Undesired current leakage is thus prevented. However, this I/O buffer needs two external control signals TN and /TN from the core circuits (not shown) to control the voltage at the floating N-well region being above 3.3V, increasing circuit complexity and requiring more wafer area.

SUMMARY OF THE INVENTION

It is therefore an object of the present invention to prevent I/O buffer from undesired current leakage when accepting an input logic signal voltage higher than the system voltage.

According to the above mentioned object, the present invention provides an I/O buffer capable of preventing undesired current leakage without external control signals from core circuits.

In the I/O buffer of the present invention, an input/output circuit has a first PMOS transistor, a first NMOS transistor and a second NMOS transistor. The input/output circuit has a transmission terminal coupled to an I/O pad. The first PMOS transistor has a floating N-well region, a gate receiving a first gate control signal, and a drain serving as the transmission terminal. A P-gate control circuit conveys the second gate control signal to the gate of the first PMOS transistor. A feedback detection device is coupled between the transmission terminal and an N-well control circuit to output a feedback signal according to an input voltage at the I/O pad. An N-well control circuit controls the voltage level at the N-well region of the first PMOS transistor according to the feedback signal output from the feedback detection device.

When the I/O buffer operates in input mode, if the input signal to the transmission terminal is 5V higher than the system voltage of 3.3V, the feedback detection device outputs a feedback signal of 0V to N-well control circuit. The N-well control circuit 130 adjusts the voltage level at the floating N-well region of the first PMOS transistor 5V. When the voltage state at the transmission terminal is switched from 5V to 0V, lower than the system voltage of 3.3V, the feedback detection device outputs a feedback signal of 5V to N-well control circuit. The N-well control circuit adjusts the voltage level at the floating N-well region of the first PMOS transistor to the system voltage (3.3 V). Thus, undesired current leakage is prevented.

BRIEF DESCRIPTION OF THE DRAWINGS

The present invention can be more fully understood by the subsequent detailed description and examples with reference made to the accompanying drawings, wherein.

DETAILED DESCRIPTION OF THE INVENTION

Figure 3:
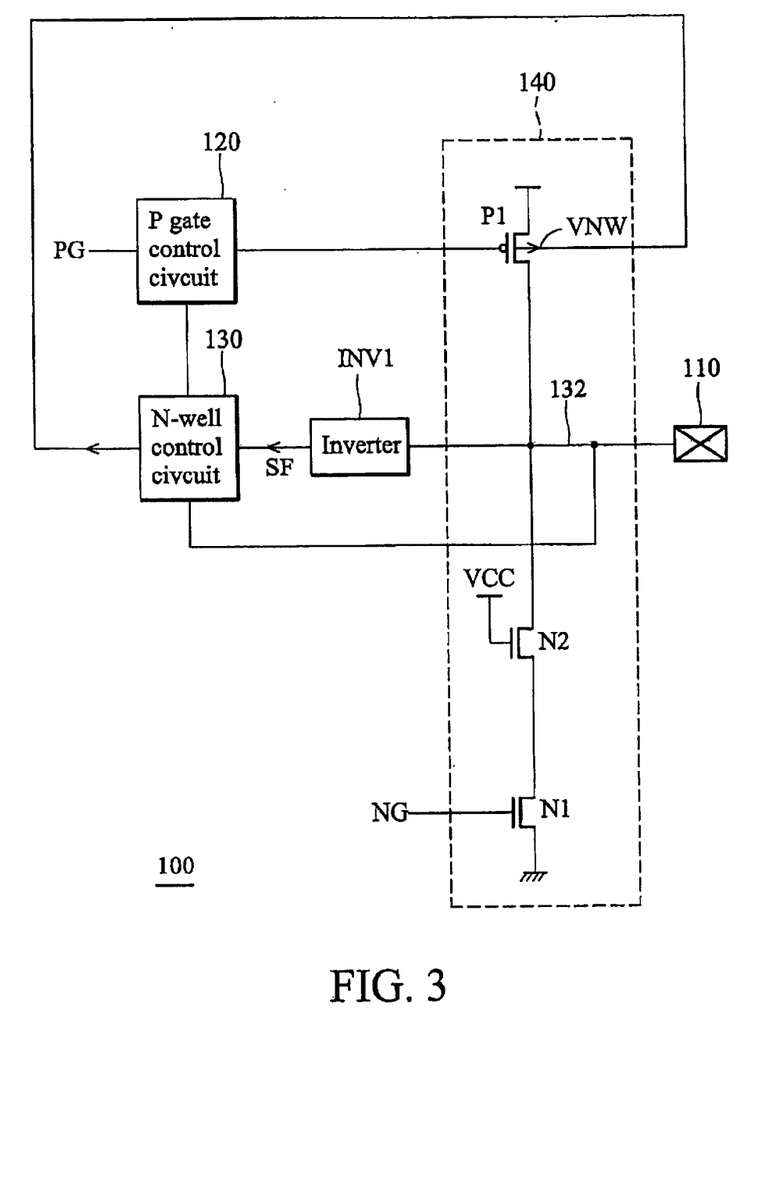
FIG. 3 is a diagram of an input/output buffer according to the present invention.

FIG. 3 is a diagram of the input/output buffer 100 according to the present invention. This I/O buffer 100 is capable of accepting an input logic signal higher in voltage level than the system voltage VCC. In the following embodiment of the present invention, the system voltage VCC is 3.3V, and the input logic signal switches between 0V and 5V, wherein the 5V high-voltage logic state is higher in voltage level than the system voltage VCC of 3.3V. However, it is to be understood that the invention is not limited to this embodiment.

As shown in FIG. 3, the input/output buffer includes an I/O circuit 140, a P-gate control circuit 120, an N-well control circuit 130, and a feedback detection device. In the present invention the feedback detection device can be an inverter INV1. The I/O circuit 140 has a PMOS transistor P1 and two NMOS transistors N1 and N2, and has an I/O port 132 coupled to an I/O pad. The PMOS transistor P1 has a floating N-well region, and a drain of the first PMOS transistor serves as the I/O port 132. The gate of the NMOS transistor N1 receives a first gate control signal NG. The NMOS transistor N2 has a source and a drain coupled to the I/O pad 110 and the drain of the NMOS transistor N1 respectively, and a gate coupled to the system voltage VCC.

The P-gate control circuit 120 is coupled between a second gate control signal PG and the gate of the first PMOS transistor to transfer a second gate control signal PG to the gate of the PMOS transistor P1. The inverter INV1 has an input and output coupled to the I/O port 132 and the N-well control circuit 130. The inverter INV1 outputs a feedback signal SF to the N-well control circuit 130 according to an input voltage at the I/O pad. The N-well control circuit 130 controls the voltage level at the floating N-well region VNW of the PMOS transistor P1 according to the feedback signal SF output from the inverter INV1.

When the I/O buffer 100 operates in input mode, the gate control signal NG is in a low-voltage logic state and the NMOS transistor N1 is turned off. At the same time, the gate control signal PG is in a high-voltage logic state and the PMOS transistor P1 is turned off. If the input signal to the I/O port 132 is 5V higher than the system voltage of 3.3V, the inverter outputs a feedback signal of 0V to N-well control circuit 130. The N-well control circuit 130 adjusts the voltage level at the floating N-well region VNW of the PMOS transistor P1 to the voltage level of 5V. When the voltage state at the I/O port 132 is switched from 5V to 0V, lower than the system voltage of 3.3V, the inverter outputs a feedback signal of 3.3V to the N-well control circuit 130. The N-well control circuit 130 adjusts the voltage level at the floating N-well region of the PMOS transistor P1 to the system voltage VCC (3.3 V). Undesired current leakage is thus prevented. Therefore, the I/O buffer 100 of the present invention can accept an input logic signal voltage higher than the system voltage and avoid undesired current leakage without using external control signals.

Figure 4:
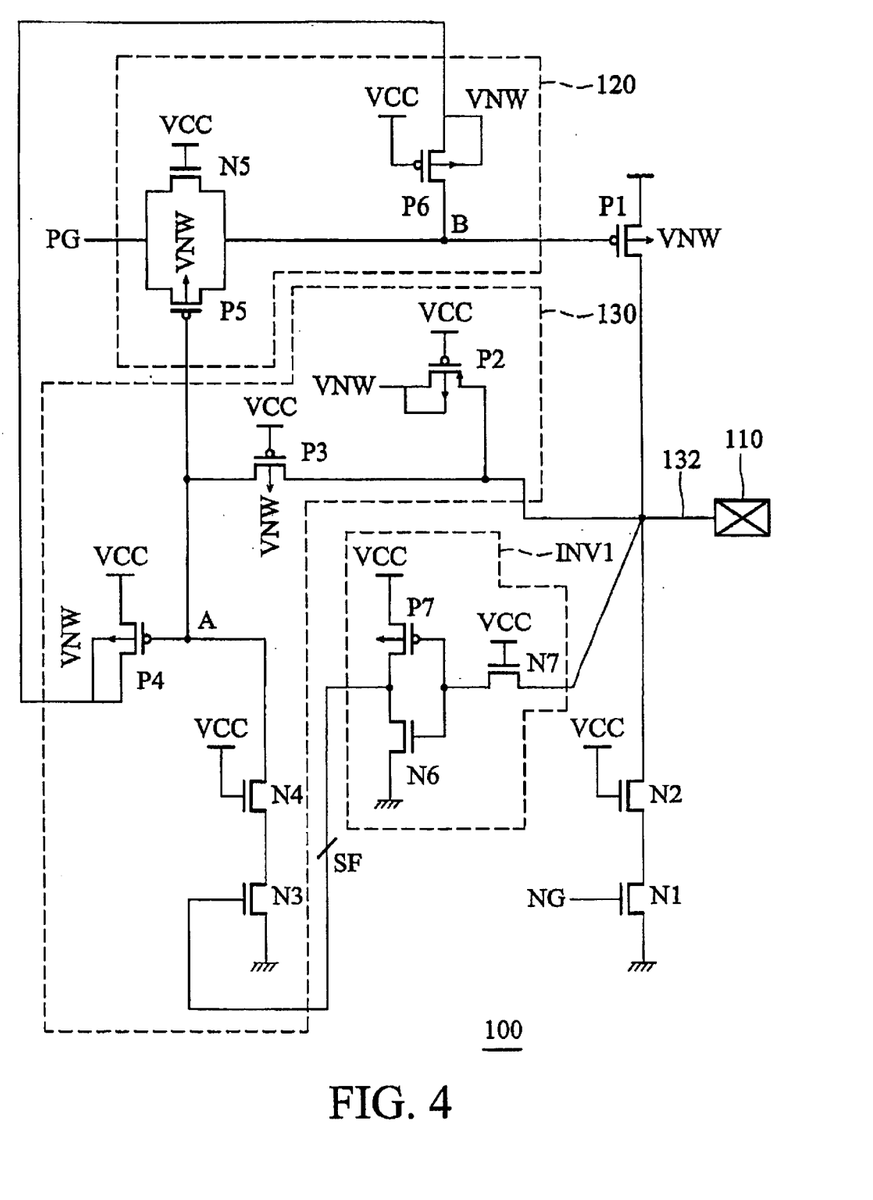
FIG. 4 is a schematic diagram showing the circuit structure of the I/O buffer according to the present invention.

FIG. 4 is a schematic diagram showing the circuit structure of the I/O buffer according to the present invention. As shown in FIG. 4, the I/O buffer includes six PMOS transistors P1, P2, P3, P4, P5 and P6, five NMOS transistors N1, N2, N3, N4 and N5 and an inverter INV1 composed of a PMOS transistor P7 and two NMOS transistors N6 and N7. Furthermore, the I/O buffer 100 is connected to an I/O pad 110 of the IC device (not shown) through an I/O port 132. The operation of the I/O buffer 100 is controlled by two gate control signals PG and NG.

In the present invention, the I/O circuit 140 is composed of a PMOS transistor P1 and two NMOS transistors N1 and N2.

In the I/O circuit 140, the NMOS transistor N1 has a gate coupled to the gate control signal NG, a source coupled to ground, and a drain. The NMOS transistor N2 has a gate coupled to the system voltage VCC, a source coupled to the drain of the NMOS transistor N1, and a drain coupled to the I/O pad 110 through the I/O port 132. The PMOS transistor P1 has a floating N-well region VNW, a gate coupled to the node B, a source coupled to the system voltage VCC and a drain coupled to the I/O pad 110 through the I/O port 132.

The N-well control circuit 130 is composed of two NMOS transistors N3 and N4 and three PMOS transistors P2, P3 and P4. In the N-well control circuit 130, the NMOS transistor N3 has a gate coupled to the drains of the PMOS transistor P7 and the NMOS transistor N6, a source coupled to ground, and a drain. The NMOS transistor N4 has a gate coupled to the system voltage VCC, a source coupled to the drain of the NMOS transistor N3, and a drain coupled to an Node A. The PMOS transistor P2 has a gate coupled to the system voltage VCC, a source coupled to the I/O pad 110 through the I/O port 132, and a drain coupled to an floating N-well VNW formed in the substrate of the IC device (not shown). The PMOS transistor P3 is coupled between the I/O pad 110 and the node A, its gate coupled to the system voltage VCC, its source coupled to the I/O pad 110 through the I/O port 132, and its drain coupled to the node A. The PMOS transistor P4 has a gate coupled to the node A, a drain coupled to the system voltage VCC, and a source coupled to the floating N-well region VNW.

Further, the P-gate control circuit 120 is composed of two PMOS transistors P5 and P6 and an NMOS transistor N5 in the present invention. In the P-gate control circuit 120, the NMOS transistor N5 is paired with the PMOS transistor P5 to form a transmission gate. The NMOS transistor N5 has a gate coupled to the system voltage VCC, and drain/source coupled to the I/O control signal PG and an Node B respectively. The PMOS transistor P5 has a gate coupled to the node A, and drain/source coupled to the I/O control signal PG and the node B respectively. The PMOS transistor P6 has a gate coupled to the system voltage VCC, a drain coupled to the node B, and a source coupled to the floating N-well region VNW.

In addition, the inverter INV1 has an input terminal coupled to the I/O port 132 and an output terminal coupled to the N-well control circuit 130. The inverter INV1 is composed of a PMOS transistor P7 and two NMOS transistors N6 and N7. In the inverter INV1, the sources of the PNOS transistor P7 and the NMOS transistor N6 are connected to the system voltage VCC and ground respectively, the gates of the PNOS transistor P7 and the NMOS transistor N6 are connected to the I/O pad 110 through the I/O port 132, and the drains of the PNOS transistor P7 and the NMOS transistor N6 are coupled to the gate of the NMOS transistor N3. Furthermore, the floating N-well region VNW is connected to the substrate in which all the PMOS transistors P1, P2, P3, P4, P5 and P6 are formed.

When the I/O buffer 100 operates in input mode, the gate control signal NG is in a low-voltage logic state and the NMOS transistor N1 is turned off. At the same time, the gate control signal PG is in a high-voltage logic state and the PMOS transistor P1 is turned off. If the input signal to the I/O port 132 is 5V, it can be transferred to the floating N-well region VNW through the PMOS transistor P2 because PMOS transistor P2 is now in a conducting state due to its gate voltage being connected to the 3.3V system voltage VCC lower than its 5V source voltage connected to the I/O port 132. Thus, the floating N-well region VNW is set at 5V.

Furthermore, the inverter INV1 outputs a feedback signal SF to the NMOS transistor N3 according to the input signal of 5V, thus turning off the NMOS transistor N3. The input signal of 5V is transferred to the PMOS transistors P4 and P5 through the PMOS transistor P3, thus turning off the PMOS transistors P4 and P5.

When the voltage state at the I/O port 132 is switched from 5V to 0V, the PMOS transistors P2 and P3 are turned off. Further, the inverter INV1 outputs a feedback signal SF to the NMOS transistor N3 according to the input signal of 0V, thus turning on the NMOS transistor N3. The voltage on the node A is grounded as the NMOS transistors N3 and N4 are turned on. As a result, the system voltage VCC is transferred to the floating N-well region VNW through the PMOS transistor P4, thereby setting the floating N-well VNW at 3.3V. Undesired current leakage is thus prevented.

In addition, when the I/O buffer 100 operates in output mode, the I/O buffer 100 outputs a high-voltage logic signal or a low-voltage logic signal according to the gate control signals NG and PG. For example, the PMOS transistor P1 is turned on and the NMOS transistor N1 is turned off to output a high-voltage logic signal when the gate control signals NG and PG are both in a low-voltage logic state. At this time, the PMOS transistor P1 is not affected by the transistors P2, P3, P4, P6, N3 and N4 and the inverter INV1. On the contrary, the PMOS transistor P1 is turned off and the NMOS transistor N1 is turned on to output a low-voltage logic signal when the gate control signals NG and PG are both in a high-voltage logic state. Therefore, in input mode, the I/O buffer 100 of the present invention can accept an input logic signal voltage higher than the system voltage and avoid undesired current leakage without using external control signals. Furthermore, in the output mode, the present invention can output a correct output signal according to two gate control signals PG and NG.

Figure 5:
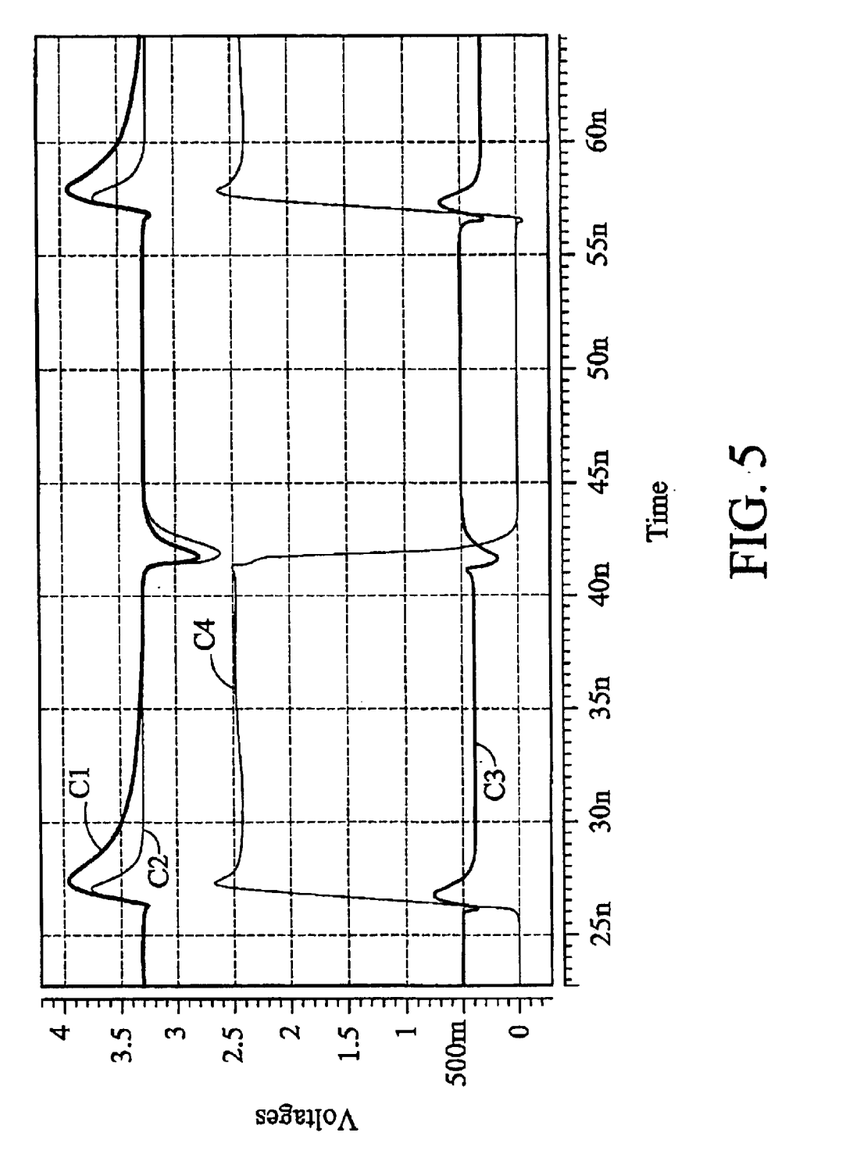
FIG. 5 is a wave diagram showing voltage levels at floating n-well regions and node A in the I/O buffer.
Figure 6:
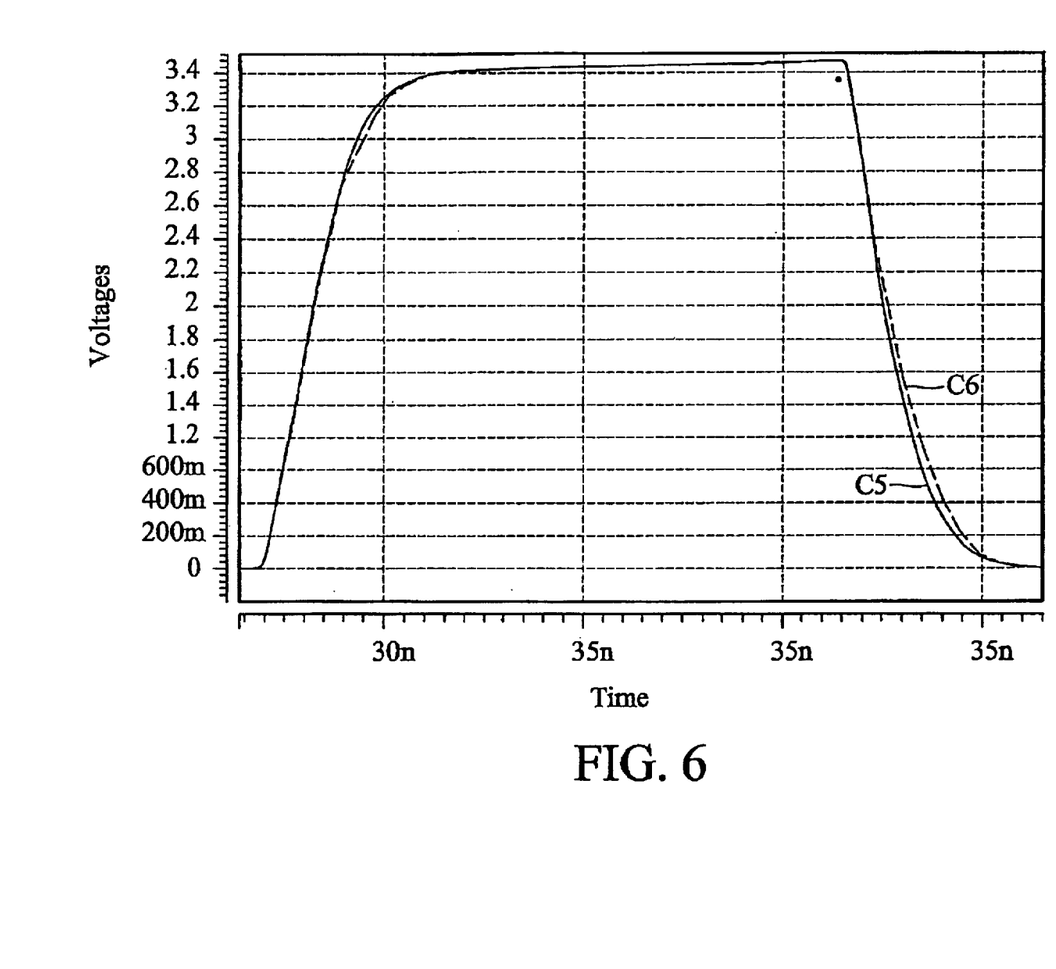
FIG. 6 is a wave diagram showing the voltage levels at the I/O port in the I/O buffer.

FIG. 5 is a wave diagram showing the voltage levels at floating N-well region and the node A. Curve C1 shows the level at the floating N-well region in the I/O buffer with feedback control according to the present invention. Curve C2 shows the voltage level at the floating N-well region in the I/O buffer without feedback control. Curve C3 shows the voltage level at node A is the I/O buffer with feedback control according to the present invention. Curve C4 shows the voltage level at the node A is the I/O buffer without feedback control. FIG. 6 is a wave diagram showing the voltage levels at the I/O port. Curve C5 shows the voltage level at I/O port in the I/O buffer with feedback control according to the present invention. Curve C6 shows the voltage level at I/O port in the I/O buffer without feedback control. As shown in FIGS. 4 and 5, the output signal in the I/O buffer with feedback control according to the present invention drop faster than without feedback control in the output mode. Thus, the present invention provides better output performance than I/O buffers without feedback control.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A feedback control I/O buffer driven by a system voltage, comprising:
   an input/output circuit comprising a first PMOS transistor and a first NMOS transistor and having a transmission terminal coupled to an I/O pad, wherein the first PMOS transistor has an N-well region, a gate of the first NMOS transistor receives a first gate control signal, and a drain of the first PMOS transistor serves as the transmission terminal;
   a P-gate control circuit conveying a second gate control signal to the gate of the first PMOS transistor;
   a feedback detection device having an input coupled to the transmission terminal to output a feedback signal according to an input voltage at the I/O pad; and
   an N-well control circuit coupled to the P-gate control circuit to control the voltage level at the N-well region of the first PMOS transistor according to the feedback signal output from the feedback detection device, wherein the N-well control circuit comprises:
   a second PMOS transistor having a source coupled to the I/O pad, a gate coupled to the system voltage, and a drain coupled to the N-well region of the first PMOS transistor;
   a third PMOS transistor having a Rate coupled to the system voltage, a source coupled to the I/O pad, and a drain;
   a fourth PMOS transistor having a gate coupled to the drain of the third PMOS transistor, a drain coupled to the system voltage, and a source coupled to the N-well region of the first PMOS transistor;
   a third NMOS transistor having a gate coupled to the feedback signal from the feedback detection device, and a source coupled to the ground, and
   a fourth NMOS transistor having a gate coupled to the system voltage, a source coupled to a drain of the third NMOS transistor, and a drain coupled to the gate of the fourth transistor.

2. The feedback control I/O buffer as claimed in claim 1, wherein the N-well control circuit adjusts the voltage level at the N-well region of the first PMOS transistor to the voltage level of the input voltage when the input voltage exceeds the system voltage.

3. The feedback control I/O buffer as claimed in claim 2, wherein the N-well control circuit adjusts the voltage level at the N-well region of the first PMOS transistor to the system voltage when the input voltage is lower than the system voltage.

4. The feedback control I/O buffer as claimed in claim 1, wherein the input/output circuit further comprises a second NMOS transistor having a source and drain coupled to the I/O pad and the drain of the first NMOS transistor respectively, and a gate coupled to the system voltage.

5. The feedback control I/O buffer as claimed in claim 1, wherein the P-gate control circuit comprises:
   a transmission gate having a fifth NMOS transistor and a fifth PMOS transistor, the sources of which are coupled to the second gate control signal, the drains of which are coupled to the gate of the first PMOS transistor, and the gates of which are coupled to the system voltage and a drain of the third PMOS transistor respectively; and a sixth PMOS transistor having a gate coupled to the system voltage, a drain coupled to the gate of the first PMOS transistor, and a source coupled to the source of the fourth transistor and the N-well region of the first PMOS transistor.

6. The feedback control I/O buffer as claimed in claim 1, wherein the feedback detection device is an inverter.

7. The feedback control I/O buffer as claimed in claim 6, wherein the inverter comprises:

a sixth NMOS transistor having a source coupled to the ground and a drain coupled to the gate of the third NMOS transistor;

a seventh PMOS transistor having a source coupled to the system voltage and a drain coupled to the drain of the sixth NMOS transistor; and a seventh NMOS transistor having a gate coupled to the system voltage, a drain coupled to the I/O pad, and a source coupled to gates of the sixth NMOS transistor and the seventh PMOS transistor.

8. An input/output buffer, comprising:

a floating N-well;

a first NMOS transistor having a gate coupled to a first gate control signal, a source coupled to the ground;

a second NMOS transistor having a gate coupled to a system voltage, a source coupled to a drain of the first NMOS transistor and a drain coupled to an I/O pad;

an inverter having an input terminal coupled to the I/O pad, and an output terminal;

a third NMOS transistor having a gate coupled to the output terminal of the inverter and a source coupled to the ground;

a fourth NMOS transistor having a source coupled to the drain of the third NMOS transistor, and a gate coupled to the system voltage;

a first PMOS transistor having a source coupled to the system voltage, and a drain coupled to the I/O pad;

a second PMOS transistor having a source coupled to the I/O pad, a gate coupled to the system voltage, and a drain coupled to the floating N-well;

a third PMOS transistor having a source coupled to I/O pad, a gate coupled to the system voltage, and a drain coupled to a source of the fourth NMOS transistor;

a fourth PMOS transistor having a gate coupled the drain of the third PMOS transistor, a drain coupled to the system voltage, and a source coupled to the floating N-well;

a transmission gate including a fifth NMOS transistor and a fifth PMOS transistor, the sources of which are coupled to a second gate control signal, the drains of which are coupled to the gate of the first PMOS transistor, and the gates of which are coupled to a drain of the third PMOS transistor and the system voltage respectively;

a sixth PMOS transistor having a gate coupled to the system voltage, a drain coupled to the gate of the first PMOS transistor and a source coupled to the floating N-well and the source of the fourth PMOS transistor;

wherein the floating N-well is connected to the substrate on which the first to sixth PMOS transistors are formed.

9. The input/output buffer as claimed in claim 8, wherein the inverter comprises:

a sixth NMOS transistor having a source coupled to the ground and a drain coupled to the gate of the third NMOS transistor;

a seventh PMOS transistor having a source coupled to the system voltage and a drain coupled to the drain of the sixth NMOS transistor; and a seventh NMOS transistor having a gate coupled to the system voltage, a drain coupled to the I/O pad, and a source coupled to gates of the sixth NMOS transistor and the seventh PMOS transistor.

* * * * *